United States Patent
Huang et al.

(10) Patent No.: US 9,966,438 B2
(45) Date of Patent: May 8, 2018

(54) METHOD OF DOPED GERMANIUM FORMATION

(71) Applicant: Applied Materials, Inc., Santa Clara, CA (US)

(72) Inventors: Yi-Chiau Huang, Fremont, CA (US); Hua Chung, San Jose, CA (US); Sheng-Chin Kung, Milpitas, CA (US); Xuebin Li, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days. days.

(21) Appl. No.: 15/418,286

(22) Filed: Jan. 27, 2017

(65) Prior Publication Data

US 2018/0083104 A1    Mar. 22, 2018

Related U.S. Application Data

(60) Provisional application No. 62/396,635, filed on Sep. 19, 2016.

(51) Int. Cl.
| | |
|---|---|
| *H01L 21/02* | (2006.01) |
| *H01L 29/167* | (2006.01) |
| *H01L 29/161* | (2006.01) |
| *H01L 21/225* | (2006.01) |
| *H01L 21/3065* | (2006.01) |

(Continued)

(52) U.S. Cl.
CPC ...... *H01L 29/167* (2013.01); *H01L 21/02057* (2013.01); *H01L 21/0262* (2013.01); *H01L 21/02532* (2013.01); *H01L 21/02636* (2013.01); *H01L 21/02639* (2013.01); *H01L 21/02656* (2013.01); *H01L 21/02667* (2013.01); *H01L 21/2018* (2013.01); *H01L 21/2033* (2013.01); *H01L 21/2053* (2013.01);

(Continued)

(58) Field of Classification Search
CPC ........... H01L 21/02532; H01L 29/7848; H01L 21/0237; H01L 21/02381; H01L 21/02636; H01L 29/167; H01L 29/41783; H01L 29/66636; Y10S 148/058; Y10S 148/059

See application file for complete search history.

(56) References Cited

U.S. PATENT DOCUMENTS

| | | |
|---|---|---|
| 5,242,847 A | 9/1993 | Ozturk et al. |
| 7,312,128 B2 | 12/2007 | Kim et al. |

(Continued)

FOREIGN PATENT DOCUMENTS

JP    2009043866 A    2/2009

OTHER PUBLICATIONS

International Search Report and Written Opinion in International Applicaton No. PCT/US2017/015368 dated Jun. 19, 2017.

*Primary Examiner* — Bac Au

(74) *Attorney, Agent, or Firm* — Patterson + Sheridan LLP

(57) ABSTRACT

Implementations described herein generally relate to methods and systems for depositing layer on substrates, and more specifically, to methods for forming boron or gallium-doped germanium on silicon-containing surfaces. In one implementation, a method of processing a substrate is provided. The method comprises exposing a substrate having an exposed silicon-germanium surface and an exposed dielectric surface to a pre-treatment process, selectively depositing a boron-doped or a gallium-doped layer on the exposed silicon-germanium surface and exposing the substrate to a post-treatment process.

19 Claims, 3 Drawing Sheets

(51) Int. Cl.
  *H01L 21/324* (2006.01)
  *H01L 21/20* (2006.01)
  *H01L 21/203* (2006.01)
  *H01L 21/205* (2006.01)

(52) U.S. Cl.
  CPC ...... *H01L 21/2252* (2013.01); *H01L 21/3065* (2013.01); *H01L 21/324* (2013.01); *H01L 29/161* (2013.01)

(56) References Cited

U.S. PATENT DOCUMENTS

| | | |
|---|---|---|
| 9,082,684 B2 | 7/2015 | Sanchez et al. |
| 9,349,864 B1 * | 5/2016 | Mcardle .............. H01L 29/7848 |
| 2002/0162505 A1 | 11/2002 | Wang |
| 2009/0039393 A1 | 2/2009 | Ono et al. |
| 2010/0120235 A1 | 5/2010 | Huang et al. |
| 2012/0077335 A1 | 3/2012 | Sanchez et al. |
| 2012/0153387 A1 | 6/2012 | Murthy et al. |
| 2013/0183814 A1 | 7/2013 | Huang et al. |
| 2013/0288480 A1 | 10/2013 | Sanchez et al. |
| 2013/0320429 A1 | 12/2013 | Thomas |

* cited by examiner

METHOD OF DOPED GERMANIUM FORMATION

CROSS-REFERENCE TO RELATED APPLICATIONS

This application claims benefit of U.S. Provisional Patent Application Ser. No. 62/396,635, filed Sep. 19, 2016, which is incorporated herein by reference in its entirety.

BACKGROUND

Field

Implementations described herein generally relate to systems and methods for depositing layer on substrates, and more specifically, to systems and methods for forming boron or gallium-doped germanium on silicon-containing surfaces.

Description of the Related Art

Germanium was one of the first materials used for semiconductor applications such as CMOS transistors. Due to the vast abundance of silicon compared to germanium, however, silicon has been the overwhelming semiconductor material of choice for CMOS manufacture. As device geometries decline according to Moore's Law, the size of transistor components poses challenges to engineers working to make devices that are smaller, faster, use less power, and generate less heat. For example, as the size of a transistor declines, the channel region of the transistor becomes smaller, and the electronic properties of the channel become less viable, with more resistivity and higher threshold voltages.

Carrier mobility is increased in the silicon channel area by using silicon-germanium stressors embedded in the source/drain areas, which enhances the intrinsic mobility of silicon. For future nodes, however, still higher mobility devices are needed.

Switching to higher mobility materials than silicon, such as germanium for pMOSFETs, has been suggested. However, the mobility of germanium is not superior to strained silicon, unless the germanium is also strained. It has been discovered that boron-doped germanium ("Ge:B") or gallium-doped germanium ("Ge:Ga") grown on the source drain region has the requisite strain for making a superior germanium pMOSFET channel, which takes advantage of the germanium/Ge:B or germanium/Ge:Ga lattice mismatch.

Thus, there is a need for improved methods of forming doped germanium and silicon-germanium materials.

SUMMARY

Implementations described herein generally relate to systems and methods for depositing layer on substrates, and more specifically, to systems and methods for forming boron or gallium-doped germanium on silicon-containing surfaces. In one implementation, a method of processing a substrate is provided. The method comprises exposing a substrate having an exposed silicon-germanium surface and an exposed dielectric surface to a pre-treatment process, selectively depositing a boron-doped or a gallium-doped layer on the exposed silicon-germanium surface and exposing the substrate to a post-treatment process.

In another implementation, a method of processing a substrate is provided. The method comprises exposing a substrate having an exposed silicon-germanium surface and an exposed dielectric surface to a pre-treatment process. The method further comprises selectively depositing a boron-doped layer on the exposed silicon-germanium surface. The selectively depositing the boron-doped layer on the exposed silicon-germanium surface comprises co-flowing a germanium source gas and a boron source gas and stopping the flow of the germanium source gas while continuing to flow the boron source gas. The method further comprises exposing the substrate to a post-treatment process.

In yet another implementation, a method of processing a substrate is provided. The method comprises exposing a substrate having an exposed silicon-germanium surface and an exposed dielectric surface to a pre-treatment process. The pre-treatment process comprises depositing a doped or undoped silicon-germanium sacrificial layer on the exposed silicon germanium surface and exposing the sacrificial layer to an etchant to remove the sacrificial layer and expose a clean silicon-germanium surface. The method further comprises selectively depositing a boron-doped layer on the exposed silicon-germanium surface. Selectively depositing the boron-doped layer on the exposed silicon-germanium surface comprises co-flowing a germanium source gas and a boron source gas and stopping the flow of the germanium source gas while continuing to flow the boron source gas. The method further comprises exposing the substrate to a post-treatment process.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
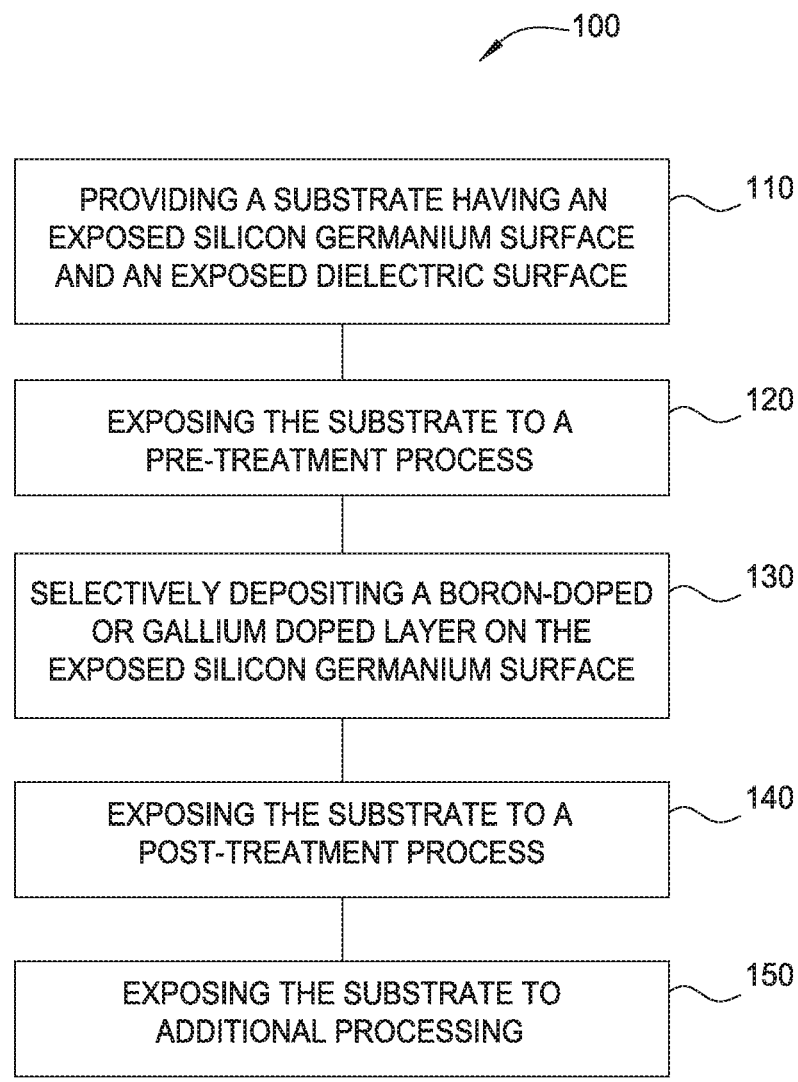
FIG. 1 depicts a flow chart of a method for depositing a boron-doped or gallium doped germanium-containing layer on a substrate in accordance with some implementations of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure generally describes methods and apparatuses for epitaxial deposition on substrate surfaces. Certain details are set forth in the following description and in FIGS. 1-3 to provide a thorough understanding of various implementations of the disclosure. Other details describing well-known structures and systems often associated with epitaxial deposition and surface preparation of substrate are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to cleaning, etching and deposition processes that can be carried out using systems available from Applied Materials, Inc. of Santa Clara, Calif. Other tools capable of performing these cleaning, etching and deposition processes may also be adapted to benefit from the implementations described herein. In addition, any system enabling the cleaning, etching and deposition processes described herein can be used to advantage. The apparatus description described herein is illustrative and should not be construed or interpreted as limiting the scope of the implementations described herein.

Boron-doped germanium and gallium-doped germanium ("Ge:B" or "Ge:Ga") are candidates for p-type contact materials in advanced planar and non-planar MOSFET. The formation of doped germanium on source/drain materials, typically boron-doped silicon-germanium or "Si(1-x)Ge (x)," typically calls for a clean surface of Si(1-x)Ge(x) for optimal contact resistance. High dopant incorporation and selectivity to dielectric materials are also desirable characteristics. Implementations of the present disclosure incorporate methods that prepare Si(1-x)Ge(x) surfaces for doped Ge formation, methods that form highly doped Ge selectively, and methods of post-treatment.

Some implementations of the present disclosure include at least one of preclean processes, processes that increase boron or gallium doping levels, processes that improve the selective formation of doped germanium, and post-deposition treatment of doped Ge surfaces to remove native oxide and other contaminants.

In some implementations, cleaning of Si(1-x)Ge(x) surface, or removal of native oxide and other contaminants on Si(1-x)Ge(x) surface is performed prior to Ge:B or Ge:Ga formation by at least one of the following processes. In some implementations, cleaning is achieved by etching the substrate in an integrated dry clean chamber. In some implementations, cleaning is achieved exposing the substrate to a short in-situ etch (in the Ge:B or Ge:Ga formation chamber) in reactive gases, such as halogens and hydrogen halides, in a thermal or plasma environment. In some implementations, cleaning is achieved by etching the substrate in an integrated dry clean chamber or etching the substrate in-situ but with a thin p-type doped or undoped Si or Ge layer as a sacrificial layer deposited on the Si(1-x)Ge(x) surfaces right after Si(1-x)Ge(x) formation. The etch cleans and removes the thin sacrificial Si or Ge layer instead of the native oxide to expose the clean Si(1-x)Ge(x) surface. In some implementations, the cleaning is achieved by exposing the substrate to a rapid thermal anneal performed in an integrated rapid thermal anneal chamber. In some implementations, cleaning is achieved by exposing the substrate to a wet-clean process. The aforementioned cleaning processes allow Ge:B or Ge:Ga deposition on a clean Si(1-x)Ge(x) surface without baking Si(1-x)Ge(x) to high temperatures (>550 degrees C.) for a long time. It has been found by the inventors that a high temperature and long bake can lead to Ge segregation from the matrix of Si(1-x)Ge(x) and generates defects.

In some implementations, increasing boron or gallium doping levels is achieved through one of, or a combination of the following. In some implementations, high-order germanes are used as the germanium source. It has been shown that in general, using digermane ($Ge_2H_6$) as the germanium source incorporates more B than germane ($GeH_4$) during in-situ boron doping. High-order germanes have high heat of formation and react more readily during CVD processes. High-order germanes include $Ge_2H_6$, $Ge_3H_8$, which is a liquid at room temperature. In some implementations, increased boron doping is achieved by interrupting the flow of germanium source gas during co-flow of Ge and B and/or Ga sources. In some implementations, occasional boron source gas only flow may increase the boron or Ga concentration of the final Ge film. In some implementations, increasing boron or gallium doping levels is achieved by recrystallization of amorphous Ge:B or Ge:Ga. Excessive boron levels often lead to amorphization the Ge film. The amorphous Ge:B can be annealed using either thermal or optical means. There can be process windows such that the Ge:B on Si or SiGe recrystallizes but the non-selective Ge:B on dielectrics does not. The amorphous Ge:B on dielectrics can be removed using etchback.

In some implementations, increased selective doped Ge formation can be achieved by one of, or a combination of the following. In some implementations, increased selective doped Ge formation is achieved by etchback of nonselective doped Ge. The etchback may be performed in halogens or halides in a thermal or plasma environment. In some implementations, increased selective doped Ge formation is achieved by co-flow of Ge source gas, B or Ga source gas, and an etchant such as halogens or halides in a thermal environment. In some implementations, increased selective doped Ge formation is achieved by co-flowing of Ge and/or B/Ga sources without involvement of additional etchants. In some implementations, increased selective doped Ge formation is achieved by co-flowing of halogenated Ge and/or halogenated B/Ga sources without involvement of additional etchants. Examples of halogenated sources include $GeCl_4$, $BCl_3$, and $BBr_3$.

In some implementations, increased cleaning of a doped Ge surface is achieved by one of, or a combination of the following post-treatment processes. In some implementations, cleaning of doped Ge surface, or removal of native oxide and other contaminants on doped Ge surface, can be performed by and of the aforementioned cleaning processes performed in part before metal deposition and silicide formation. Also, since germanium oxide dissolves in water, water in its liquid or vapor form can be considered as one reagent for post-treatment of Ge:B or Ge:Ga.

Figure 2A:
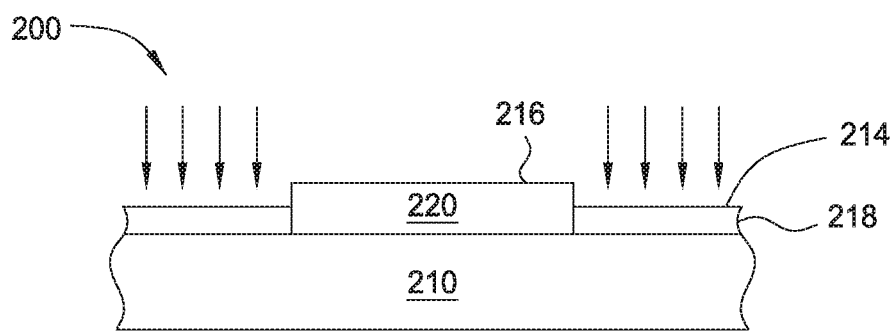
FIGS. 2A-2C depict the stages of fabrication of a boron-doped or gallium doped germanium-containing layer on a substrate in accordance with some implementations of the present disclosure.
Figure 2B:
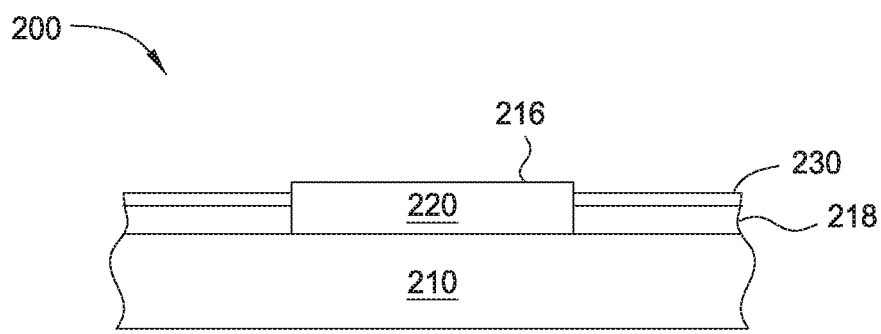
Figure 2C:
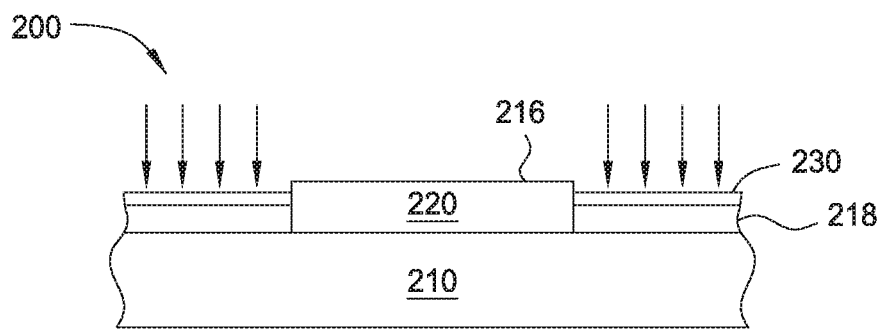

FIG. 1 depicts a flow chart of a processing sequence 100 for depositing a boron-doped or gallium doped germanium-containing layer on a substrate in accordance with some implementations of the present disclosure. The processing sequence 100 is performed upon a workpiece 200 during the fabrication process. The processing sequence 100 may be used to form a structure as depicted in the sequence of fabrication stages depicted in FIGS. 2A-2C, which are discussed below. FIGS. 2A-2C depict cross-sectional schematic views of a workpiece 200 processed according to implementations described herein. Although FIG. 1 is described with reference to a specific structure, it should be understood that reference to the specific structure is only illustrative and the processes described in FIG. 1 are applicable to any process where it is desirable to selectively deposit a film on a substrate containing multiple materials.

The implementations of the substrate 210 as illustrated in FIG. 2A are merely exemplary and other suitable configurations of the substrate 210 are possible. For example, as illustrated in FIG. 2A, the substrate 210 may be part of a partially formed device, such as a metal-oxide-semiconductor field effect transistor (MOSFET). However, other devices, such as fin field effect transistors (FinFETs) or the like, may be used with the inventive methods disclosed herein. The boron-doped or gallium-doped layer formed herein may be used in source/drain regions or channel regions of transistor devices, as optoelectronic bandgap materials, in complementary metal oxide semiconductor (CMOS) applications, N-type MOS device (NMOS) channel regions, P-type MOS device (PMOS) channel regions, or the like.

At operation 110, a substrate having at least an exposed silicon-germanium surface and an exposed dielectric surface is provided. The substrate may be similar to substrate 210 depicted in FIGS. 2A-2C. In one implementation, the exposed silicon-germanium surface is a boron-doped silicon-germanium surface. In one implementation, the substrate 210 may comprise a material such as crystalline silicon (e.g., Si<100> or Si<111>), silicon oxide, strained silicon, silicon-germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, and combinations thereof. The substrate 210 may have various dimensions, such as 200 mm, 300 mm, and 450 mm or other diameter, as well as, being a rectangular or square panel. Unless otherwise noted, implementations and examples described herein are conducted on substrates with a 200 mm diameter, a 300 mm diameter, or a 450 mm diameter substrate. In the implementation depicted herein, the substrate 210 may be a crystalline silicon substrate. Moreover, the substrate 210 is not limited to any particular size or shape. The substrate 210 may be a round substrate having a 200 mm diameter, a 300 mm diameter or other diameters, such as 450 mm, among others. The substrate 210 may also be any polygonal, square, rectangular, curved or otherwise non-circular workpiece, such as a polygonal glass substrate used in the fabrication of flat panel displays. In one implementation, the substrate 210 is patterned. In one implementation, the substrate 210 has a planar surface. In another implementation, the substrate 210 has three-dimensional features formed thereon.

As illustrated in FIG. 2A, the substrate 210 may include a first surface 214 and a second surface 216. In some implementations, the first surface 214 may be an exposed surface of a silicon-germanium layer 218 formed on the substrate 210. For example, the silicon-germanium layer 218 may include one or more silicon (Si), germanium (Ge), boron (B), gallium (Ga), or other suitable materials. In some implementations, the first surface 214 may be an exposed surface of the substrate 210 as shown. For example, the substrate 210 may include one or more silicon (Si), germanium (Ge), silicon-germanium (SiGe) or other suitable substrate materials. In some implementations, the second surface 216 may be part of a dielectric layer, such as a dielectric layer 220 disposed on the substrate 210. For example, the dielectric layer may comprise one or more of silicon oxide ($SiO_2$), silicon nitride ($Si_3N_4$), or other suitable materials than may be used to form a dielectric layer.

At operation 120, the substrate 210 is exposed to a pre-treatment process. Any suitable pre-treatment process that removes oxides from the substrate without significantly damaging the substrate may be used during operation 120. Suitable cleaning processes include sputter etch processes, plasma etch processes, wet etch processes, anneal processes, or combinations thereof. In operation 120, cleaning of first surface 214 (e.g., Si(1-x)Ge(x), wherein x is 0<x<1), or removal of native oxide and other contaminants on first surface 214, can be performed in at least one of the following processes prior to operation 130.

In some implementations, the pre-treatment process is a first process that includes an etching process in an integrated dry clean chamber. In one implementation, the etching process is a plasma etching process. In some implementations, the pre-treatment process is a second process that includes a short in-situ etching process (e.g., in Ge:B or Ge:Ga formation chamber) in reactive gases, such as halogens and hydrogen halides, in a thermal or plasma environment. In some implementations, the pre-treatment process includes a third process that includes etching via the first process or the second process, but with a thin p-type doped or undoped silicon or germanium layer as a sacrificial layer deposited on the first surface 214 right after formation of the silicon-germanium layer 218. The third process cleans and removes the thin sacrificial silicon or germanium layer instead of the native oxide to expose the first surface 214. In some implementations, the pre-treatment process includes a fourth process that includes exposing the substrate to a rapid thermal anneal process. The rapid thermal anneal process may be performed in an anneal chamber that is integrated in a substrate processing system. In some implementations, the pre-treatment process includes a fifth process that includes any integrated sequence of the first process, the second process, the third process, and the fourth process listed above. In some implementations, the pre-treatment process includes a sixth process that includes a combination of a wet clean process and the integrated rapid thermal anneal of the fifth process.

Not to be bound by theory but it is believed that the pre-treatment process of operation 120 facilitates the boron-doped or gallium-doped layer of operation 130 on a clean Si(1-x)Ge(x) surface without baking Si(1-x)Ge(x) to high temperatures (e.g., greater than 550 degrees Celsius) for a long period of time. A high temperature and long bake can lead to Ge segregation from the matrix of Si(1-x)Ge(x) and generate defects.

In one implementation, operation 120 is performed in a processing region of a first processing chamber. In one implementation, the first processing chamber is positioned on a cluster tool (e.g., processing system 300) allowing for transfer of the substrate without exposing the substrate to atmosphere (e.g., in a vacuum environment.) In another implementation, the first processing chamber is separate from the cluster tool such that the substrate is exposed to atmosphere during removal and/or transfer of the substrate.

Exemplary wet etch processes include wet etch processes using hydrofluoric acid (HF). Exemplary cleaning processes include $NF_3/NH_3$ plasma-based processes, hot hydrofluoric ("HF")/$NH_3$ based processes, wet HF processes, or $NF_3$/$NH_3$ inductively coupled plasma processes.

In one implementation, the pre-treatment process is a plasma-etch process. In one implementation, the plasma etch process involves the simultaneous exposure of a substrate to $NF_3$ and $NH_3$ plasma by-products. The plasma etch process may be a capacitively coupled plasma (CCP) process or an inductively coupled plasma (ICP) process. In one implementation, the plasma etch process is a remote plasma assisted dry etch process which involves the simultaneous exposure of a substrate to $NF_3$ and $NH_3$ plasma by-products. In one example, the plasma etch process may be similar to or may include a SiCoNi™ etch process that is available from Applied Materials, Inc. of Santa Clara, Calif. In some implementations, remote plasma excitation of the gas species allows for plasma-damage-free substrate processing. The remote plasma etch can be largely conformal and selective towards silicon oxide layers, and thus does not readily etch silicon regardless of whether the silicon is amorphous, crystalline or polycrystalline. The remote plasma process will generally produce solid by-products, which grow on the surface of the substrate as substrate material is removed. The solid by-products can be subsequently removed via sublimation when the temperature of the substrate is raised. The plasma etch process results in a substrate surface having silicon-hydrogen (Si—H) bonds thereon. The plasma process may be a capacitively coupled plasma process or an inductively coupled plasma process.

In one implementation, the plasma etch process is a capacitively coupled plasma (CCP) process. In one implementation, the plasma etch process may include an $NF_3$ flow rate within a range of about 1 sccm to about 20 sccm, such as about 5 sccm, as well as an $NH_3$ flow rate within a range of about 50 sccm to about 200 sccm, such as about 100 sccm. In one implementation, the plasma etch process may further include an inert gas (argon, helium, or both argon and helium) at an inert gas flow rate within a range of between about 100 sccm and about 1,000 sccm (e.g., between about 200 sccm and about 500; between about 300 sccm and about 400 sccm). The plasma etch process may be performed at a pressure of between about 1 Torr and about 10 Torr (e.g., between about 2 Torr and about 5 Torr, between about 4 Torr and about 5 Torr; or about 5 Torr). The plasma etch process may be performed at an RF power setting of between about 20 Watts and about 50 Watts (e.g., between about 20 Watts to about 40 Watts; between about 25 Watts to about 35 Watts, or about 30 Watts) may be utilized to ionize the $NF_3$ and the $NH_3$. By-products may then be sublimated from the surface of the substrate by annealing the substrate at a temperature of about 120 degrees Celsius or more for about 5 seconds to about 100 seconds, such as about 60 seconds.

Other implementations of fluorine based cleaning involve, reacting $NH_3$ gas and $F_2$ or anhydrous HF gas in either plasma or thermal heat to etch $SiO_2$ native oxides. Examples of gas flow ratios used in the fluorine based cleaning are between 1:1 to 1:20 gas flow ratio of fluorine gas to $NH_3$ gas (between 1:1 to 10:1 gas flow ratio of $NF_3$ to $NH_3$ gas; between 3:1 to 20:1 gas flow ratio of $NF_3$ to $NH_3$ gas; or between 3:1 to 10:1 gas flow ratio of $NF_3$ to $NH_3$ gas) at temperatures of 15 degrees Celsius to 130 degrees Celsius (e.g., 20 degrees Celsius to 100 degrees Celsius).

In another implementation, the plasma etch process is an inductively coupled plasma process. The inductively coupled plasma etch process includes an $NF_3$ flow rate within a range of about 1 sccm to about 20 sccm, such as about 5 sccm, as well as an $NH_3$ flow rate within a range of about 50 sccm to about 200 sccm, such as about 100 sccm. In one implementation, the inductively coupled plasma etch process may further include an inert gas (argon, helium, or both argon and helium) at an inert gas flow rate within a range of between about 500 sccm and about 1,0000 sccm (e.g., between about 1,000 sccm and about 5,000; or between about 1,000 sccm and about 2,000 sccm).

The plasma etch process may be performed at a pressure of between about 100 mTorr and about 500 mTorr (e.g., between about 200 mTorr and about 500 mTorr, between about 400 mTorr and about 500 mTorr; or about 500 mTorr).

The plasma etch process may be performed at an RF power setting of between about 100 Watts and about 500 Watts (e.g., between about 200 Watts to about 400 Watts; between about 250 Watts to about 350 Watts, or about 300 Watts) may be utilized to ionize the $NF_3$ and the $NH_3$. By-products may then be sublimated from the surface of the substrate by annealing the substrate at a temperature of about 120 degrees Celsius or more for about 5 seconds to about 100 seconds, such as about 60 seconds.

Examples of gas flow ratios would be between 1:1 to 1:20 gas flow ratio of $NF_3$ gas to $NH_3$ gas (between 1:1 to 10:1 gas flow ratio of $NF_3$ to $NH_3$ gas; between 3:1 to 20:1 gas flow ratio of $NF_3$ to $NH_3$ gas; or between 3:1 to 10:1 gas flow ratio of $NF_3$ to $NH_3$ gas) at temperatures of 0 degrees Celsius to 50 degrees Celsius (e.g., 20 degrees Celsius to 40 degrees Celsius).

In another implementation, the pre-treatment process is a chemical oxide removal process including treatment with thermal $NH_3$ and anhydrous hydrofluoric acid (HF). The chemical oxide removal process may be performed at a pressure of between about 100 mTorr and about 2,000 mTorr (e.g., between about 200 mTorr and about 1,000 mTorr, between about 400 mTorr and about 500 mTorr; or about 500 mTorr). Examples of flow ratios would be between 1:1 to 1:10 flow ratio of $NH_3$ gas to anhydrous HF (between 1:1 to 5:1 gas flow ratio of $NF_3$ to anhydrous HF; or between 1:1 to 2:1 flow ratio of $NH_3$ to anhydrous HF) at temperatures of 0 degrees Celsius to 100 degrees Celsius (e.g., 20 degrees Celsius to 40 degrees Celsius).

In one implementation, the chemical oxide removal process may further include an inert gas (argon, helium, nitrogen or combinations thereof) at an inert gas flow rate within a range of between about 500 sccm and about 1,0000 sccm (e.g., between about 1,000 sccm and about 5,000; or between about 1,000 sccm and about 2,000 sccm).

In another implementation, the substrate is exposed to a wet clean process. The substrate may be cleaned using a wet cleaning process in which a cleaning solution, such as a HF-last type cleaning solution, ozonated water cleaning solution, hydrofluoric acid (HF) and hydrogen peroxide ($H_2O_2$) solution, or other suitable cleaning solution. The cleaning solution may be heated.

In another implementation, a different pre-treatment process is utilized to clean the substrate surface. In one implementation, plasma containing Ar and $NF_3$ is introduced into the processing chamber. In another implementation, a remote plasma containing He and $NF_3$ is introduced into a processing chamber through a gas distribution plate, such as a showerhead. $NH_3$ may be directly injected into the chamber via a separate gas inlet.

In one implementation, after operation 120, the substrate is removed from a first processing chamber and transferred to a second processing chamber where operation 130 is performed. In one implementation, operation 120 is performed in a processing region of a first processing chamber. In one implementation, both operation 120 and operation 130 are performed in the same processing chamber. In one implementation, the first processing chamber is positioned on a cluster tool allowing for transfer of the substrate without exposing the substrate to atmosphere (e.g., in a vacuum environment.)

At operation 130 as illustrated in FIG. 2B, a boron-doped or gallium-doped germanium layer 230 is selectively deposited on the first surface 214 of the silicon-germanium layer 218. Operation 130 achieves increased doping levels of boron or gallium concentration in epitaxial germanium through at least one of the following processes. In some implementations where the doped-germanium layer is a gallium-doped germanium layer, gallium may be implanted in the germanium layer via an implant process.

In some implementations, the selective deposition process is a first process that includes using higher-order germanes as the germanium source. Not to be bound by theory but it is believed that higher-order germanes (e.g., digermane ($Ge_2H_6$)) as the germanium source incorporates more boron than germane ($GeH_4$) during in-situ boron doping. Higher-order germanes have high heat of formation and react more readily in a chemical vapor deposition process. The germanes can include $GeH_4$, $Ge_2H_6$, $Ge_3H_8$, etc.

In some implementations, the selective deposition process is a second process that includes interrupting the flow of the germanium source during co-flow of germanium and boron and/or gallium. Occasional boron gas source only flow may also increase the boron concentration of the final germanium film.

In some implementations, the selective deposition process is a third process that includes recrystallization of amorphous Ge:B or Ge:Ga. Not to be bound by theory but it is believed that excessive boron levels often lead to amorphization of the germanium film. The amorphous Ge:B can be annealed using either thermal or optical means. There can be process windows such that the Ge:B on Si or SiGe recrystallizes but the non-selective Ge:B on dielectrics does not. If so, the amorphous Ge:B on dielectrics can be removed using an etchback process.

Selective deposition of doped germanium layer 230 may be achieved by at least one of the following. A first process including etchback of nonselective doped Ge. The etchback can be performed in halogens or halides in a thermal or plasma environment to remove doped germanium from the second surface 216. A second process includes co-flowing of the germanium source, boron or gallium source gas, and an etchant gas such as halogens (e.g., HCl) or halides in a thermal environment. A third process including co-flow of germanium and/or boron or gallium sources without involvement of additional etchants. A fourth process including co-flow of halogenated germanium and/or halogenated boron or gallium sources without involvement of additional etchants. Examples of halogenated source gases include $GeCl_4$, $BCl_3$, and BBr3.

During operation 130, the doped germanium layer 230 may be deposited using an epitaxial deposition process. The surface of the substrate is contaminant free, which improves the quality of the epitaxial layer subsequently formed on the surface of the substrate. In one example, the epitaxial deposition may be a selective epitaxial deposition process performed at a temperature that is less than 800 degrees Celsius. In this example, the temperature is set such that it will not exceed 800 degrees Celsius, in order to limit the wafer thermal budget for delicate features that may distort or diffuse if overheated.

In one implementation, the epitaxial layer is deposited using a high temperature chemical vapor deposition (CVD) process. In this thermal CVD process, processing gases such as halogenated boron sources, halogenated gallium sources, boron sources, germanium sources, etchant gas source, a carrier gas, or combinations thereof are used to deposit the epitaxial layer. In one implementation, the processing temperature is under 800 degrees Celsius and the processing pressure is between 5 and 600 Torr.

In one implementation during operation 130, a germanium source (e.g., $GeH_4$, $Ge_2H_6$, $Ge_3H_8$, etc.), a boron source or gallium source, and optionally a carrier gas (e.g., $H_2$ and/or $N_2$) are supplied. The flow rate of the boron source may be in the range from about 100 sccm to about 500 sccm. The flow rate of the carrier gas may be in the range from about 1,000 sccm to about 60,000 sccm. The flow rate of the carrier gas may be in the range from about 10,000 sccm to about 20,000 sccm. The flow rate of the germanium source may be in the range from about 10 sccm to about 500 sccm. The flow rate of the germanium source may be in the range from about 50 sccm to about 100 sccm. The processing chamber may be maintained with a pressure from about 0.1 Torr to about 200 Torr (e.g., from about 10 Torr to about 50 Torr; about 20 Torr). The substrate may be kept at a temperature in the range from about 400 degrees Celsius to about 1,000 degrees Celsius (e.g., from about 500 degrees Celsius to about 600 degrees Celsius). The process is conducted to form the doped-germanium layer with a thickness in a range from about 10 Å to about 3,000 Å. The dopant concentration is in the range from about 1 atomic percent to about 75 atomic percent of the doped germanium layer (e.g., from about 50 atomic percent to about 70 atomic percent, about 65 atomic percent).

The germanium source gas may be provided at a rate of about 0.1 sccm to about 500 sccm (e.g., about 0.1 sccm to about 1 sccm; about 0.1 sccm to about 10 sccm; about 80 sccm to about 200 sccm; about 90 sccm to about 150 sccm; about 1 sccm). Germanium source gases may include one or more of germane ($GeH_4$), higher germanes, or chlorinated germanium derivatives, such as germanium dichloride ($GeCl_2$), germanium tetrachloride ($GeCl_4$), or dichlorogermane ($Cl_2GeH_2$). Higher germanes include compounds with the empirical formula $Ge_xH_{(2x+2)}$ wherein x is 1, 2, 3, 4, etc. such as digermane ($Ge_2H_6$), trigermane ($Ge_3H_8$) and tetragermane ($Ge_4H_{10}$), as well as others.

The boron source gas may be provided at a rate of about 0.1 sccm to about 500 sccm (e.g., about 0.1 sccm to about 1 sccm; about 0.1 sccm to about 10 sccm; about 80 sccm to about 200 sccm; about 90 sccm to about 150 sccm; about 1 sccm). Boron source gases may include suitable boron-containing compounds. Suitable boron-containing compounds include diborane ($B_2H_6$), dimethylamine borane (DMAB or [$NH(CH_3)_2BH_3$]), trimethylborane (TMB or $B(CH_3)_3$), triethylborane (TEB), combinations thereof and similar compounds.

The carrier gas is usually provided into the processing chamber at a flow rate within a range from about 1 slm to about 100 slm (e.g., from about 5 slm to about 80 slm; from about 10 slm to about 40 slm; about 20 slm). Carrier gases may include nitrogen ($N_2$), hydrogen ($H_2$), argon, helium or combinations thereof. In one implementation, an inert carrier gas is used. The inert carrier gas includes nitrogen, argon, helium or combinations thereof. A carrier gas may be selected based on the precursor(s) used and/or the process temperature of the deposition process.

In one implementation, after operation 130, the substrate 210 is removed from the second processing chamber and transferred to a third processing chamber where operation 130 is performed. In one implementation, operation 130 is performed in a processing region of a second processing chamber. In one implementation, both the first processing chamber and the second processing chamber are positioned on a cluster tool allowing for transfer of the substrate from the first processing chamber to the second processing chamber without exposing the substrate to atmosphere (e.g., in a vacuum environment.) In one implementation, operation 120 and operation 140 are performed in the same processing chamber. In one implementation, operation 130 and operation 140 are performed in the same processing chamber. In one implementation, operation 120, operation 130, and operation 140 are performed in the same processing chamber.

At operation 140 as illustrated in FIG. 2C, the substrate 210 is exposed to a post-treatment process before additional processing at operation 150. Cleaning of doped germanium surface, or removal of native oxide and other contaminants from the doped germanium surface can be performed by any of the methods of operation 110. Also, since germanium oxide dissolves in water, water in its liquid or vapor form can be considered as one reagent for post-treatment of Ge:B or Ge:Ga.

At operation 150, the substrate 210 is exposed to additional processing. Additional processing may include, for example, metal deposition (e.g., Ti and TiN) and silicide formation.

Figure 3:
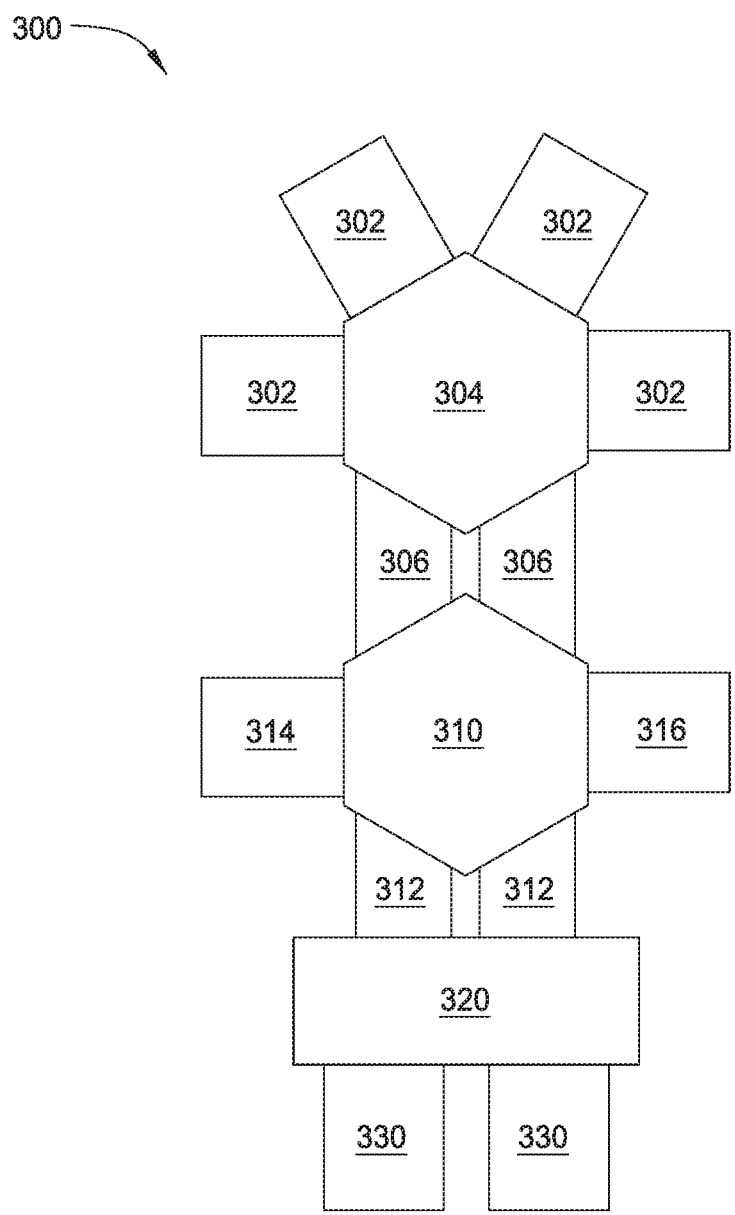
FIG. 3 is a schematic top view of a processing system that can be used to complete the processing sequence illustrated in FIG. 1 according to implementations described herein.

FIG. 3 illustrates a processing system 300 that can be used to complete the processing sequence 100 illustrated in FIG. 1, according to implementations of the disclosure. One example of the processing system 300 is the ENDURA® system available from Applied Materials, Inc., of Santa Clara, Calif. As shown in FIG. 3, a plurality of processing chambers 302 are coupled to a first transfer chamber 304. The processing chamber may include any combination of pre-clean chambers, implant chamber, anneal chambers, dopant chambers, and post-treatment chambers that are configured to perform the aforementioned processes. The first transfer chamber 304 is also coupled to a first pair of pass-through chambers 306. The first transfer chamber 304 has a centrally disposed transfer robot (not shown) for transferring substrates between the processing chambers 302 and the pass-through chambers 306. The processing chambers 302 are coupled to a second transfer chamber 310, which is coupled to a cleaning chamber 314 for cleaning the substrate (operation 120) and an etching chamber 316 for etching the substrate (operation 140). The second transfer chamber 310 has a centrally disposed transfer robot (not shown) for transferring substrates between a set of load-lock chambers 312 and the cleaning chamber 314 or the etching chamber 316. The cleaning chamber 314 may be configured to perform the Applied Materials SICONI™ Preclean process.

A factory interface 320 is connected to the second transfer chamber 310 by the load-lock chambers 312. The factory interface 320 is coupled to one or more pods 330 on the opposite side of the load-lock chambers 312. The pods 330 typically are front opening unified pods (FOUP) that are accessible from the clean room.

During operation, a substrate is first transferred to the cleaning chamber 314 where a cleaning process is performed to remove contaminants such as carbon or hydrocarbons from the substrate surface, breakthrough oxides formed on the surface of the substrate, or both. The cleaning process is described in FIG. 1 under operation 120. Then the substrate is transferred to the processing chambers 302 in which the deposition process as described under operation 130 is performed. Then the substrate is transferred back to the cleaning chamber 314 in which the post-treatment process of operation 140. Optionally, the substrate may be transferred to etching chamber 316 where the etchback process is performed.

In some implementations, because all three operations 120, 130 and 140 are performed within the same processing system, vacuum is not broken as the substrate is transferred to various chambers, which decreases the chance of contamination and improves the quality of the deposited doped germanium film.

In summary, some of the benefits of some of the implementations of the present disclosure provided methods for forming boron-doped germanium and gallium-doped germanium for p-type contact materials. The methods provide clean $Si(1-x)Ge(x)$ surfaces, which lead to optimal contact resistance. The methods further provide for high dopant incorporation with selectivity to dielectric materials. Further, because the pre-treatment processes, doping processes, and post-treatment processes are performed within the same processing system, vacuum is not broken as the substrate is transferred to various chambers, which decreases the chance of contamination and improves the quality of the deposited doped germanium film.

Having disclosed several implementations, it will be recognized by those of skill in the art that various modifications, alternative constructions, and equivalents may be used without departing from the spirit of the disclosed implementations. Additionally, a number of well-known processes and elements have not been described in order to avoid unnecessarily obscuring the present disclosure. Accordingly, the above description should not be taken as limiting the scope of the disclosure.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. A method of processing a substrate, comprising:
   exposing a substrate having an exposed silicon-germanium surface and an exposed dielectric surface to a pre-treatment process;
   selectively depositing a boron-doped germanium layer on the exposed silicon-germanium surface, wherein the selectively depositing the boron-doped germanium layer on the exposed silicon-germanium surface comprises:
      co-flowing a germanium source gas and a boron source gas;
      stopping the flow of the germanium source gas while continuing to flow the boron source gas to deposit an amorphous boron-doped germanium layer on the exposed silicon-germanium surface and the exposed dielectric surface;
      annealing the amorphous boron-doped germanium layer to recrystallize the amorphous boron-doped germanium layer formed on the exposed silicon-germanium surface while the amorphous boron-doped germanium layer formed on the exposed dielectric surface remains amorphous; and
      etching the amorphous boron-doped germanium layer formed on the exposed dielectric surface; and
   exposing the substrate to a post-treatment process.

2. The method of claim 1, wherein the pre-treatment process includes at least one of:
   an etching process in an integrated dry clean chamber;
   an in-situ etching process in reactive gases in a thermal or plasma environment, wherein the reactive gases include halogens, hydrogen halides, or combinations thereof;

depositing a p-type doped or undoped silicon or germanium layer as a sacrificial layer on the exposed silicon-germanium surface;
exposing the substrate to a rapid thermal anneal process; and
exposing the substrate to a wet-clean process.

3. The method of claim 2, wherein the
germanium source gas is selected from germane ($GeH_4$), germanium dichloride ($GeCl_2$), germanium tetrachloride ($GeCl_4$), dichlorogermane ($Cl_2GeH_2$), digermane ($Ge_2H_6$), trigermane ($Ge_3H_8$), tetragermane ($Ge_4H_{10}$), and combinations thereof and
the boron source gas is selected from diborane ($B_2H_6$), dimethylamine borane, trimethylborane, triethylborane, and combinations thereof.

4. The method of claim 3, wherein the post-treatment process includes at least one of:
an etching process in an integrated dry clean chamber;
an in-situ etching process in reactive gases in a thermal or plasma environment, wherein the reactive gases include halogens, hydrogen halides, or combinations thereof;
exposing the substrate to a rapid thermal anneal process; and
exposing the substrate to a wet-clean process.

5. The method of claim 4, wherein the pre-treatment process, the selectively depositing the boron-doped germanium layer, and the post-treatment process are performed without exposing the substrate to atmosphere.

6. The method of claim 1, wherein the pre-treatment process comprises simultaneously exposing the substrate to $NF_3$ and Ar plasma by-products.

7. The method of claim 1, wherein the germanium source gas is selected from digermane ($Ge_2H_6$), trigermane ($Ge_3H_8$), tetragermane ($Ge_4H_{10}$), and combinations thereof.

8. A method of processing a substrate, comprising:
exposing a substrate having an exposed silicon-germanium surface and an exposed dielectric surface to a pre-treatment process, wherein the pre-treatment process comprises;
simultaneously exposing the substrate to $NF_3$ and $NH_3$ plasma by-products;
selectively depositing a boron-doped germanium layer on the exposed silicon-germanium surface, wherein the selectively depositing the boron-doped germanium layer on the exposed silicon-germanium surface comprises:
co-flowing a germanium source gas and a boron source gas;
stopping the flow of the germanium source gas while continuing to flow the boron source gas to deposit an amorphous boron-doped germanium layer on the exposed silicon-germanium surface and the exposed dielectric surface;
annealing the amorphous boron-doped germanium layer to recrystallize the amorphous boron-doped germanium layer formed on the exposed silicon-germanium surface while the amorphous boron-doped germanium layer formed on the exposed dielectric surface remains amorphous; and
etching the amorphous boron-doped germanium layer formed on the exposed dielectric surface; and
exposing the substrate to a post-treatment process.

9. The method of claim 8, wherein the germanium source gas is selected from germane ($GeH_4$), germanium dichloride ($GeCl_2$), germanium tetrachloride ($GeCl_4$), dichlorogermane ($Cl_2GeH_2$), digermane ($Ge_2H_6$), trigermane ($Ge_3H_8$), tetragermane ($Ge_4H_{10}$), and combinations thereof.

10. The method of claim 9, wherein the boron source gas is selected from diborane ($B_2H_6$), dimethylamine borane, trimethylborane, triethylborane, and combinations thereof.

11. The method of claim 8, wherein co-flowing the germanium source gas and the boron source gas comprises:
flowing the germanium source gas at a flow rate from about 0.1 sccm to about 1 sccm; and
flowing the boron source gas at a flow rate from about 1 sccm to about 10 sccm.

12. The method of claim 8, wherein the germanium source gas is selected from digermane ($Ge_2H_6$), trigermane ($Ge_3H_8$), tetragermane ($Ge_4H_{10}$), and combinations thereof.

13. A method of processing a substrate, comprising:
exposing a substrate having an exposed silicon-germanium surface and an exposed dielectric surface to a pre-treatment process, wherein the pre-treatment process comprises:
depositing a doped or undoped silicon-germanium sacrificial layer on the exposed silicon germanium surface; and
exposing the sacrificial layer to an etchant to remove the sacrificial layer and expose a clean silicon-germanium surface;
selectively depositing a boron-doped germanium layer on the exposed silicon-germanium surface, wherein the selectively depositing the boron-doped germanium layer on the exposed silicon-germanium surface comprises:
co-flowing a germanium source gas and a boron source gas;
stopping the flow of the germanium source gas while continuing to flow the boron source gas to deposit an amorphous boron-doped germanium layer on the exposed silicon-germanium surface and the exposed dielectric surface;
annealing the amorphous boron-doped germanium layer to recrystallize the amorphous boron-doped germanium layer formed on the exposed silicon-germanium surface while the amorphous boron-doped germanium layer formed on the exposed dielectric surface remains amorphous; and
etching the amorphous boron-doped germanium layer formed on the exposed dielectric surface; and
exposing the substrate to a post-treatment process.

14. The method of claim 13, wherein co-flowing the germanium source gas and the boron source gas comprises:
flowing the germanium source gas at a flow rate from about 0.1 sccm to about 1 sccm; and
flowing the boron source gas at a flow rate from about 1 sccm to about 10 sccm.

15. The method of any of claim 13, wherein the pre-treatment process, the selectively depositing the boron-doped germanium layer, and the post-treatment process are performed without exposing the substrate to atmosphere.

16. The method of claim 13, wherein the germanium source gas is selected from germane ($GeH_4$), germanium dichloride ($GeCl_2$), germanium tetrachloride ($GeCl_4$), dichlorogermane ($Cl_2GeH_2$), digermane ($Ge_2H_6$), trigermane ($Ge_3H_8$), tetragermane ($Ge_4H_{10}$), and combinations thereof.

17. The method of claim 16, wherein the boron source gas is selected from diborane ($B_2H_6$), dimethylamine borane, trimethylborane, triethylborane, and combinations thereof.

18. The method of claim 13, wherein the post-treatment process includes at least one of:

an etching process in an integrated dry clean chamber;
an in-situ etching process in reactive gases in a thermal or plasma environment, wherein the reactive gases include halogens, hydrogen halides, or combinations thereof;
exposing the substrate to a rapid thermal anneal process; and
exposing the substrate to a wet-clean process.

19. The method of claim 13, wherein the germanium source gas is selected from digermane ($Ge_2H_6$), trigermane ($Ge_3H_8$), tetragermane ($Ge_4H_{10}$), and combinations thereof.

* * * * *